United States Patent [19]
Tseng

[11] Patent Number: 5,837,575
[45] Date of Patent: Nov. 17, 1998

[54] METHOD FOR FORMING A DRAM CAPACITOR

[75] Inventor: Horng-Huei Tseng, Hsinchu, Taiwan

[73] Assignee: Vanguard International Semiconductor Corporation, Hsinchu, Taiwan

[21] Appl. No.: 731,261

[22] Filed: Oct. 11, 1996

[51] Int. Cl.[6] .................................................. H01L 21/8242
[52] U.S. Cl. ........................... 438/253; 438/254; 438/397
[58] Field of Search ..................... 438/238, 239, 438/253–256, 381, 396–399

[56] References Cited

U.S. PATENT DOCUMENTS

| 5,429,980 | 7/1995 | Yang et al. | 438/254 |
| 5,521,112 | 5/1996 | Tseng | 438/253 |
| 5,712,182 | 1/1998 | Madan | 438/253 |

*Primary Examiner*—Joni Chang
*Attorney, Agent, or Firm*—Christensen, O'Connor, Johnson & Kindness PLLC

[57] ABSTRACT

An improved method for forming a dynamic random access memory (DRAM) cell capacitor with increased capacitance is disclosed. The method includes forming a planarized dielectric layer on a semiconductor substrate. Then a minimum dimension trench is formed to expose the source region of the DRAM cell MOSFET, thereby forming the node contact for the bottom storage node of the DRAM cell capacitor. A thick doped polysilicon layer is then formed over the dielectric layer, filling the trench. A nitride layer is formed on the dielectric layer. Thereafter, a photoresist layer is formed on the silicon nitride layer and patterned to form a minimum dimension mask aligned with the polysilicon filled trench in the dielectric layer. The photoresist mask is then etched, causing the photoresist mask to be narrower than the minimum dimension. The silicon nitride layer is then anisotropically etched to expose the polysilicon layer. After stripping the photoresist mask, a silicon nitride mask is formed on the polysilicon layer. A polysilicon-oxide layer is then grown by thermal oxidation. The silicon nitride mask is then removed, leaving a portion of the polysilicon layer exposed. The polysilicon layer is then etched using the polysilicon-oxide layer as a mask, thereby forming a deep trench that is narrower than the minimum dimension. The polysilicon-oxide layer is removed to expose the polysilicon layer. The polysilicon layer is then patterned and etched to removed the polysilicon layer around the trench. The resulting polysilicon structure forms a bottom electrode of the DRAM cell capacitor.

11 Claims, 5 Drawing Sheets

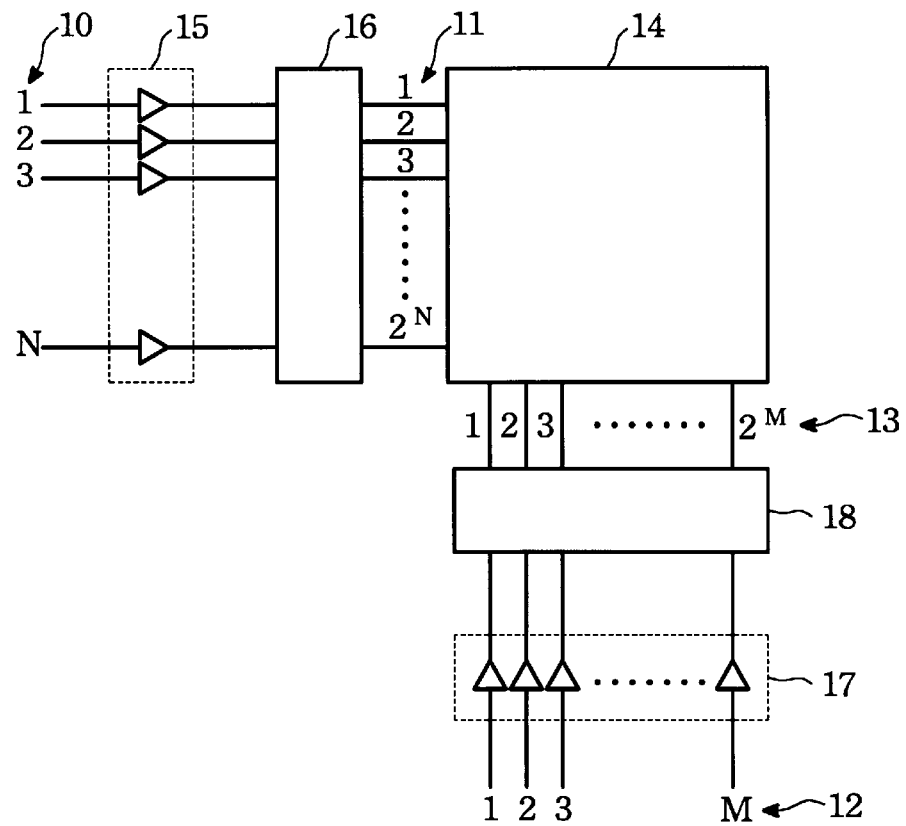
FIG.1
(Prior Art)
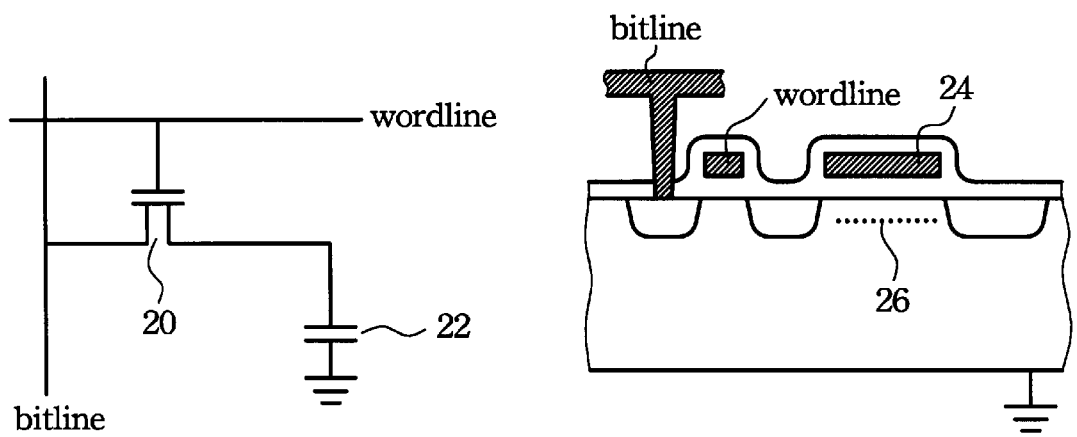
FIG.2A
(Prior Art)
FIG.2B
(Prior Art)

METHOD FOR FORMING A DRAM CAPACITOR

BACKGROUND OF THE INVENTION

1. Field of the Invention

The present invention relates to dynamic random access memory (DRAM) fabrication, and more particularly to a method for forming a capacitor of a dynamic random access memory cell.

2. Description of the Prior Art

Recently, demand for semiconductor devices has rapidly increased owing to widespread use of electronic equipment. In particular, the increasing popularity of some electronic equipment such as, for example, computers is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are called word lines 11, and the vertical lines connected to all of the cells in the column are referred to as bit lines 13. Data flow into and out of the cells via those bit lines.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18 respectively. The row decoder 16 and the column decoder 18 then respectively select the appropriate word line and bit line corresponding to the received address signal. The word and bit lines select a particular memory cell of the memory 14 corresponding to the received address signals. The row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type metal-oxide-semiconductor (PMOS) technology. Later, U.S. Pat. No. 3,387,286 titled "FIELD EFFECT TRANSISTOR MEMORY" by R. H. Dennard disclosed a DRAM storage cell structure consisting of one transistor and one capacitor. A circuit schematic diagram of this structure is shown in FIG. 2A. The gate of the transistor 20 is controlled by a word line signal, and data represented by the logic level of a capacitor voltage, is written into or read out of the capacitor 22 through a bit line signal. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes highly integrated, the area occupied by a capacitor of a DRAM storage cell shrinks, thus decreasing the capacitance of the capacitor owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, which achieves both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing its capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size only can be reduced at the cost of further reducing the depth of focus and restricting the flexibility in the design of three-dimensional structures. Thus, there is a need for a method of forming a DRAM capacitor with features that are smaller than the minimum feature size of the photolithographic process.

SUMMARY OF THE INVENTION

In accordance with the present invention, a method is provided for forming a DRAM capacitor that occupies a relatively small area of the wafer surface and having a relatively high capacitance. In one embodiment, a planarized dielectric layer is formed on a semiconductor substrate with a metal-oxide-semiconductor field effect transistor (MOSFET) conventionally formed on and in the substrate. Then a trench with a minimum dimension width, i.e., at the smallest width allowed by the photolithography process, is formed to expose the source region of the MOSFET, thereby forming the node contact for the bottom storage node of the DRAM cell capacitor. A relatively thick doped polysilicon layer is then formed over the dielectric layer, filling the trench. The polysilicon layer can be optionally planarized by chemical mechanical polishing (CMP). A silicon nitride layer is then formed on the dielectric layer. Thereafter, a photoresist layer is formed on the silicon nitride layer and patterned to form a minimum dimension mask aligned with the polysilicon filled trench in the dielectric layer. The photoresist mask is then partially etched using an isotropic etching process, thus causing the photoresist mask to be narrower than the minimum dimension. The silicon nitride layer is then anisotropically etched to expose the polysilicon layer. After stripping the photoresist mask, a silicon nitride mask is formed on the polysilicon layer, partially covering the polysilicon-filled trench. A polysilicon-oxide layer is then grown by thermal oxidation. The silicon nitride mask is then removed, leaving a portion of the polysilicon layer exposed. The polysilicon layer is then etched using the polysilicon-oxide layer as a mask, thereby forming a deep trench that is narrower than the minimum dimension. After the polysilicon-oxide layer is removed, the polysilicon layer is exposed. The polysilicon layer is then patterned and etched to remove the polysilicon layer around the opening of the trench. The resulting polysilicon structure serves as a bottom electrode of the DRAM cell capacitor and includes a sub-minimum dimension trench. The trench increases the electrode surface area, thereby causing the capacitor to have a relatively large capacitance while occupying a relatively small area of the wafer surface.

BRIEF DESCRIPTION OF THE DRAWINGS

FIG. 1 shows a simplified diagram of the organization of large semiconductor memories.

FIG. 2A shows a circuit schematic diagram of a dynamic random access memory (DRAM).

FIG. 2B shows a cross sectional view illustrative of a traditional one-transistor DRAM storage cell.

DESCRIPTION OF THE PREFERRED EMBODIMENT

Figure 3:
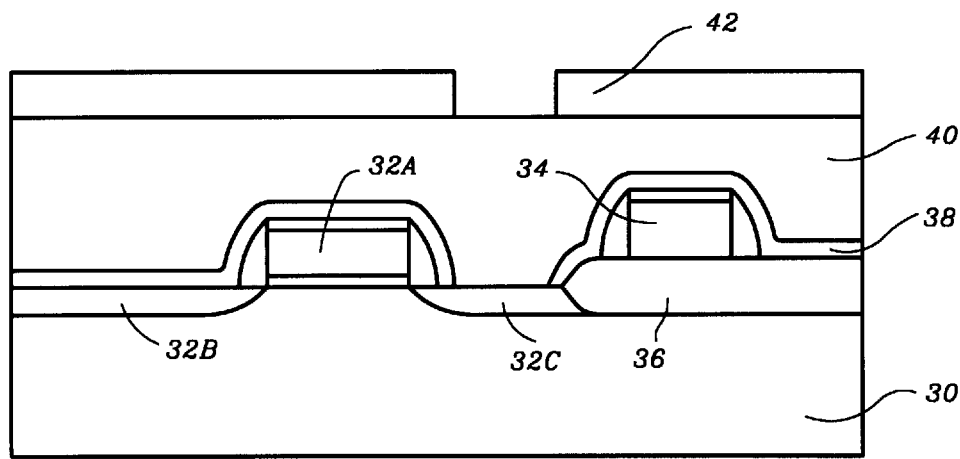
FIGS. 3 to 9 show cross-sectional views illustrative of various stages in the fabrication of a DRAM capacitor in accordance with one embodiment of the present invention.

Referring to FIG. 3, a MOSFET having a gate 32A, a drain 32B and a source 32C, is conventionally formed in and on the substrate 30. A conformal oxide layer 38 is formed using a low pressure chemical vapor deposition (LPCVD) method, typically to a thickness of about 600 to 1500 angstroms. Further, a word line 34 is formed over a field oxide (FOX) region 36. Typically, the word line 34 is made of doped polysilicon. In this embodiment, the MOSFET is a n-channel MOSFET that forms part of a dynamic random access memory (DRAM) cell. A dielectric layer 40 such as a Borophosphosilicate glass (BPSG) layer is deposited using a conventional low pressure chemical vapor deposition (LPCVD) process or a plasma-enhanced chemical vapor deposition (PECVD) process. The thickness of the dielectric layer 40 can be about 3000 to 10000 angstroms.

After planarization of the dielectric layer 40, via use of an etch back or other conventional planarization method such as chemical mechanical polishing (CMP), conventional photolithography techniques are then used to define a storage node area in a photoresist layer 42 formed on dielectric layer 40. The photoresist layer is patterned to expose a portion of the dielectric layer 40 over a portion of a source 32C. In order to fabricate a high density transistor, the width of the exposed portion of the dielectric layer 40 is chosen at or near the minimum feature size.

Using the photoresist layer 42 as a mask, the dielectric layer 40 is etched, via use of a heated solution of phosphoric acid, $H_3PO_4$, and the oxide layer 38 is etched via use of a diluted HF solution. A trench 44 is thus formed in the dielectric layer 40 as shown in FIG. 4, by exposing the portion of the source region 32C.

Figure 4:
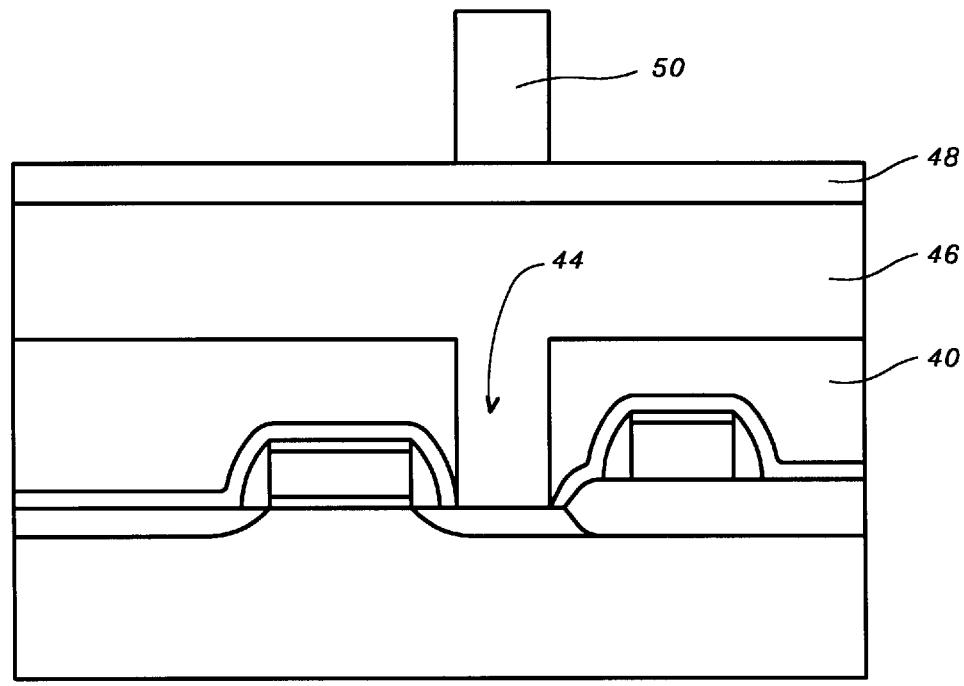

A thick doped polysilicon layer 46, shown in FIG. 4, is formed on the dielectric layer 40 so as to fill the trench 44. The nominal thickness of the doped polysilicon layer 46 above the dielectric layer 40 is about 6000 angstroms, but can range from about 4000 to 8000 angstroms. A planarization method such as CMP can be further used to planarize the surface of the doped polysilicon layer 46. Typically, the polysilicon layer 46 is doped with $p^{31}$ dopants at a concentration of about 1E20 atoms/cm$^2$ to increase conductivity.

Figure 5:
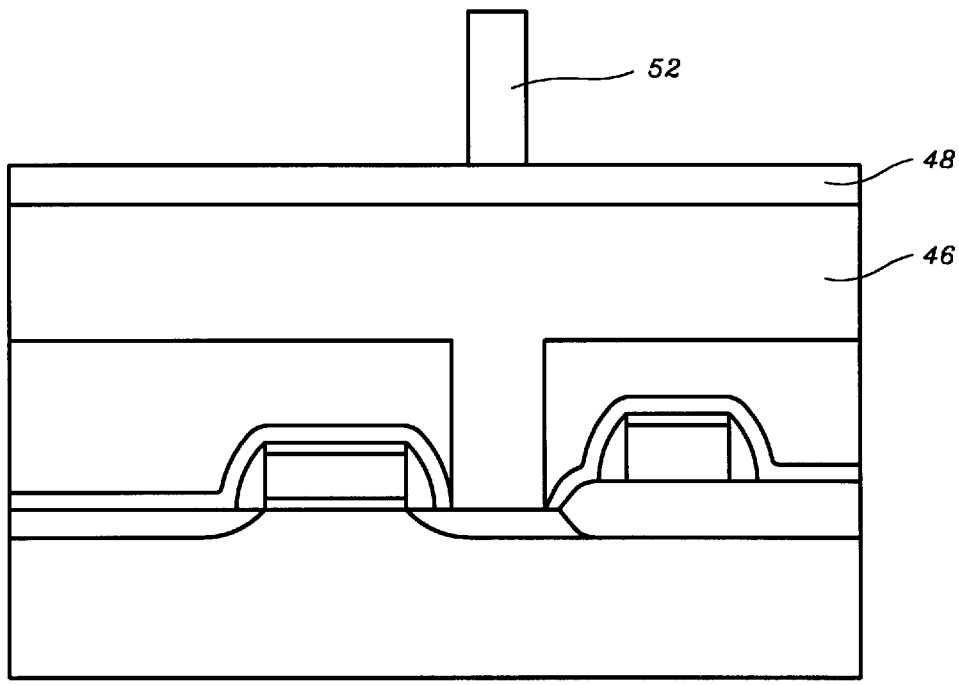

A thin silicon nitride layer 48 is then deposited on the doped polysilicon layer 46 using a conventional LPCVD process or PECVD process. The thickness of the silicon nitride layer 48 is about 600 angstroms, but can range about 300 to 1000 angstroms. Conventional photolithography techniques are then used to mask a portion of the silicon nitride layer 48 above the trench 44 using a photoresist 50. The width of the patterned photoresist 50 is also chosen at or near the minimum feature size, and the pattern is aligned with the polysilicon filled trench 44 in the dielectric layer 40. The photoresist layer 50 is then isotropically etched using an oxygen gas plasma, thus causing the photoresist mask 52 to be narrower than the minimum feature size, as shown in FIG. 5.

Figure 6:
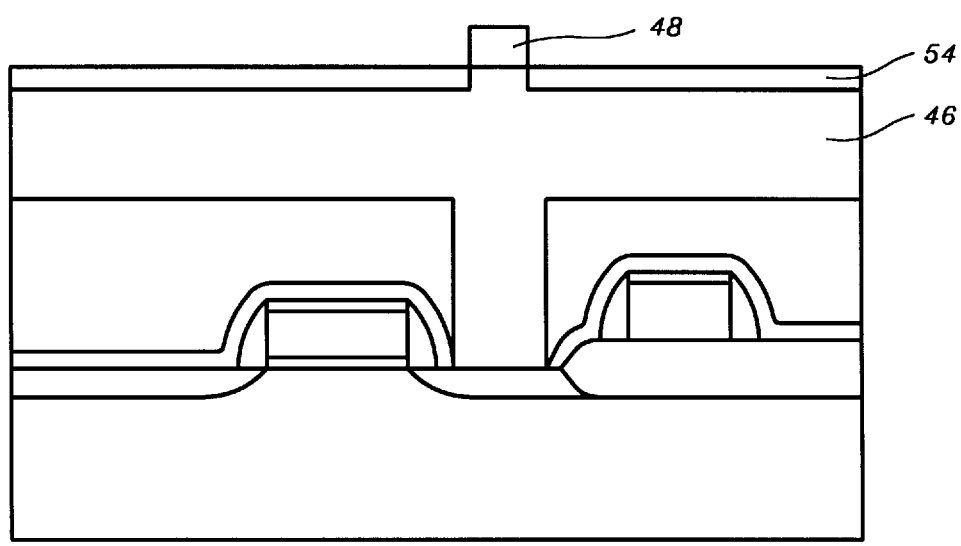

The silicon nitride layer 48 is then anisotropically etched using etchant such as $CF_4+Ar+O_2$ plasma to expose the polysilicon layer 46 as shown in FIG. 6. After the photoresist mask 52 is conventionally stripped, a silicon nitride mask 48 is formed on the polysilicon layer 46.

The polysilicon layer 46 is then subjected to thermal oxidation at about 800°–900° C., using the silicon nitride mask 48 as a mask. Consequently, the polysilicon layer 46 grows a polysilicon-oxide layer 54 to a thickness of about 300 to 600 angstroms at the surface of the polysilicon layer 46. The silicon nitride mask 48 prevents thermal oxidation of the polysilicon beneath the mask.

Figure 7:
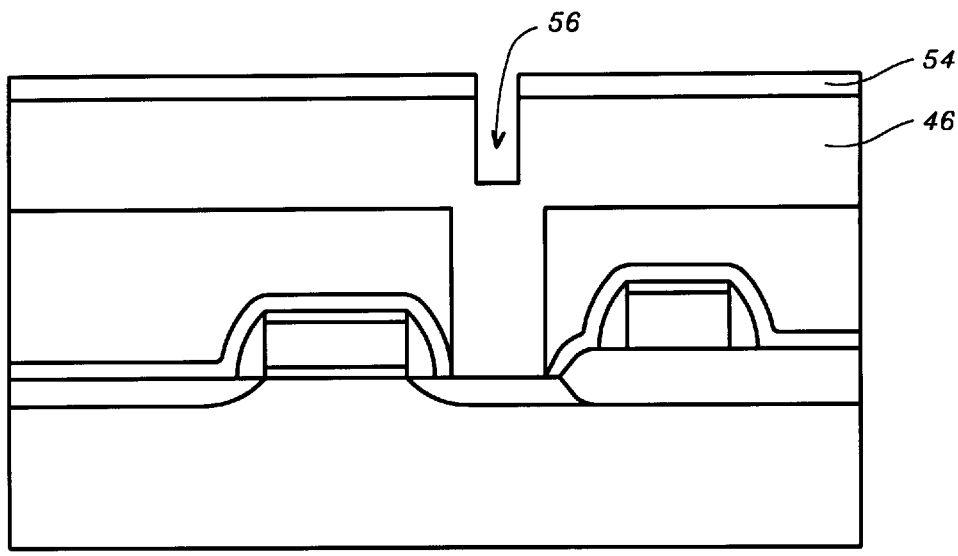

The silicon nitride mask 48 is then removed by etching using a $H_3PO_4$ process. Removing the silicon nitride mask 48 exposes a portion of the polysilicon layer 46 that is narrower than the minimum feature size of the photolithography process used. The polysilicon layer 46 is then etched using the polysilicon-oxide layer 54 as a mask, thereby forming a deep trench 56 that is narrower than the minimum feature size, as shown is FIG. 7. A plasma etching process with a $SF_6/O_2$ etchant can be used to etch the polysilicon layer 46 not covered by the polysilicon-oxide layer 54.

Figure 8:
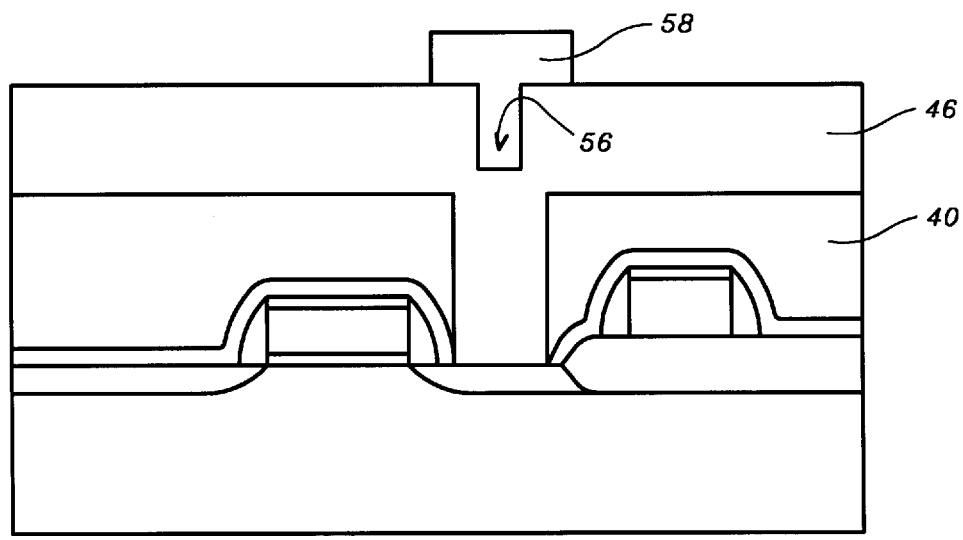

After removing the polysilicon-oxide layer 54 by etching in a buffered or diluted HF solution, a further photoresist mask 58, shown in FIG. 8, is patterned around the trench 56 using standard photolithography techniques. The photoresist mask 58 is formed to fill the trench 56, and is slightly wider than the minimum feature size. Of course, in other embodiments, the width of the photoresist mask 58 can be varied. The polysilicon layer 46 is then etched until the dielectric layer 40 is exposed. A plasma etching process using a $SF_6/O_2$ etchant can be performed to etch the polysilicon layer 46 not covered by the photoresist mask 58.

Figure 9:
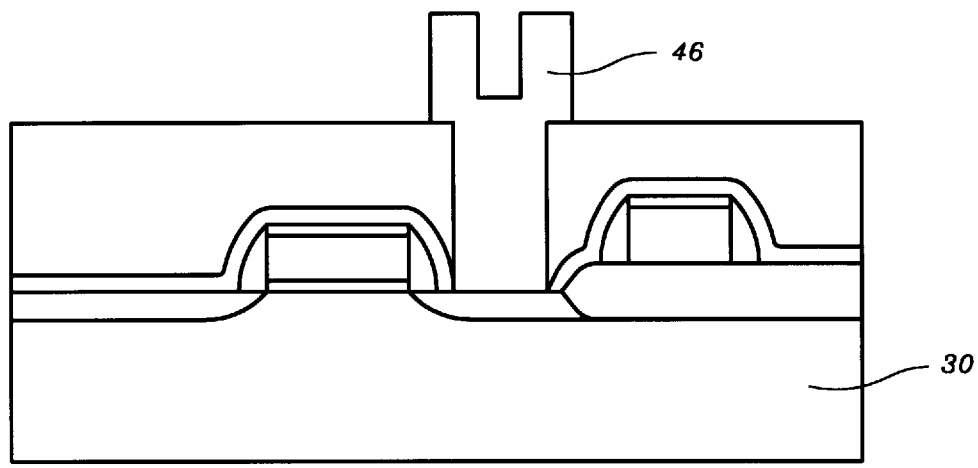

FIG. 9 shows the resulting polysilicon structure 46, which serves as a bottom electrode of the DRAM cell capacitor. The bottom electrode includes a sub-minimum feature size trench. The trench increases the surface area of the electrode, which increases the capacitance of the capacitor. Moreover, the bottom electrode has a very narrow horizontal cross-section, thereby causing the capacitor to occupy a relatively small area on the surface of the substrate 30. The dielectric layer and the top electrode of the DRAM cell capacitor can then be formed in the conventional manner after removing the dielectric layer 40.

Although specific embodiments, including the preferred embodiment, have been illustrated and described, it will be appreciated by those skilled in the art that various modification may be made without departing from the spirit which is intended to be limited solely by the appended claims.

What is claimed is:

1. A method for forming a capacitor of a dynamic random access memory cell, said method comprising:
   forming a dielectric layer on a substrate;
   forming and patterning a first photoresist layer on the dielectric layer, said first photoresist layer defining a storage node area over a portion of a substrate surface;
   removing a portion of said dielectric layer to form a first trench using the first photoresist layer as a mask, thereby exposing said portion of the substrate surface;

removing said first photoresist layer;

forming a doped polysilicon layer over the dielectric layer, said first trench in the dielectric layer being filled by the doped polysilicon layer;

forming a nitride layer on said doped polysilicon layer;

forming and patterning a second photoresist layer on said nitride layer, wherein said second photoresist layer covering the storage node area over the portion of the substrate surface;

isotropically etching said second photoresist layer, thereby narrowing a width of said second photoresist layer;

anisotropically etching said nitride layer using said etched second photoresist layer as a mask, thereby forming a nitride mask; removing said etched second photoresist layer;

forming an oxide layer on said doped polysilicon layer not covered by said nitride mask;

removing said nitride mask, thereby exposing a portion of said doped polysilicon layer;

anisotropically etching said exposed portion of said doped polysilicon layer to form a second trench;

removing said oxide layer to expose a top surface of said doped polysilicon layer;

forming and patterning a third photoresist layer on the etched doped polysilicon layer, said third photoresist layer covering the first trench; and removing portions of said doped polysilicon layer not covered by said third photoresist layer, thereby forming a bottom electrode of the capacitor of the dynamic random access memory cell.

2. The method according to claim 1, wherein said substrate includes a metal-oxide-semiconductor transistor formed in and on the substrate, said metal-oxide-semiconductor transistor being a part of the dynamic random access memory cell.

3. The method according to claim 1, further comprising planarizing said dielectric layer.

4. The method according to claim 1, wherein said dielectric layer is a Borophosphosilicate glass layer.

5. The method according to claim 1, wherein said first trench in the dielectric layer has a width of about a minimum feature size of a photolithography process.

6. The method according to claim 1, wherein said doped polysilicon layer has a thickness of between about 4000 to 8000 angstroms.

7. The method according to claim 1, further comprising planarizing said doped polysilicon layer.

8. The method according to claim 1, wherein said forming and patterning said second photoresist layer comprises patterning said second photoresist layer to have a width of about a minimum feature size of a photolithography process.

9. The method according to claim 1, wherein said isotropically etching said second photoresist layer comprises etching by using an oxygen gas plasma.

10. The method according to claim 1, wherein said oxide layer has a thickness of between about 300 to 600 angstroms.

11. The method according to claim 1, wherein said forming said oxide layer comprises forming a polysilicon-oxide layer by thermal oxidation at about 800°–900° C.

* * * * *